United States Patent
Thakur et al.

[11] Patent Number: 5,264,396
[45] Date of Patent: Nov. 23, 1993

[54] METHOD FOR ENHANCING NITRIDATION AND OXIDATION GROWTH BY INTRODUCING PULSED NF$_3$

[75] Inventors: Randhir P. S. Thakur, Boise; Richard C. Hawthorne, Nampa; Annette L. Martin; Gurtej S. Sandhu, both of Boise, all of Id.

[73] Assignee: Micron Semiconductor, Inc., Boise, Id.

[21] Appl. No.: 4,326

[22] Filed: Jan. 14, 1993

[51] Int. Cl.$^5$ ............................................. H01L 21/02
[52] U.S. Cl. .................................... 437/238; 437/235; 437/241; 437/243; 437/242; 437/244; 148/DIG. 112
[58] Field of Search ............... 437/235, 241, 242, 243, 437/244, 238; 148/DIG. 112

[56] References Cited

U.S. PATENT DOCUMENTS

| | | | |
|---|---|---|---|
| 4,389,973 | 6/1983 | Suntola et al. | 118/725 |
| 4,715,937 | 12/1987 | Moslehi et al. | 437/241 |
| 5,032,545 | 7/1991 | Doan et al. | 437/242 |
| 5,043,224 | 8/1991 | Jaccodine et al. | 437/241 |

Primary Examiner—Brian E. Hearn
Assistant Examiner—Trung Dang
Attorney, Agent, or Firm—Ozer M. N. Teitelbaum

[57] ABSTRACT

A method and system for fabricating semiconductor wafers is disclosed, wherein a rugged and/or smooth, atomically clean, semiconductor substrate is provided in a rapid thermal processing ("RTP") chamber. The substrate can be single crystal, polycrystalline or amorphous silicon. In one embodiment of the present invention, the substrate is cleaned by exposing it to at least one of $CF_4$, $C_2F_2$, $C_2F_6$, $C_4F_8$, $CHF_3$, HF, $NF_6$, and $NF_3$ diluted with Ar-$H_2$ at a temperature substantially within the range of 650° C. to 1150° C. for approximately 10 to 60 seconds in the chamber. Subsequently, the clean substrate is exposed to a first gas and energy generating a first temperature substantially within the range of 650° C. to 1150° C. in situ under substantially high vacuum for approximately 5 seconds to 20 seconds. Simultaneous to exposing the substrate to the first gas, a second gas comprising fluorine as an oxidizing agent, preferably $NF_3$, is advanced by pulsing its introduction in situ under substantially high vacuum. By pulsing the introduction of the second gas, an on phase substantially in the range of 2 seconds to 5 seconds and an off phase substantially in the range of 5 seconds to 6 seconds is established. Preferably, the pulsing comprises two on and two off phases. In one embodiment of the present inventive method, the first gas comprises at least one of $O_2$ and $N_2O$ in combination with Ar to thereby fabricate a silicon dioxide layer superjacent the substrate.

28 Claims, 3 Drawing Sheets

METHOD FOR ENHANCING NITRIDATION AND OXIDATION GROWTH BY INTRODUCING PULSED NF₃

FIELD OF THE INVENTION

This invention relates to semiconductor processes and to a method for enhancing nitridation and oxidation growth. More particularly, the invention relates to a process for improving the fabrication of thin gate and cell dielectric layers by introducing pulsed $NF_3$.

BACKGROUND OF THE INVENTION

The continuing trend of scaling down integrated circuits has forced the semiconductor industry to consider new techniques for fabricating precise components at submicron levels. Along with the need for smaller components, there has been a growing demand for devices requiring less power consumption. In the manufacture of transistors, these trends have led the industry to refine approaches to achieve thinner cell dielectric and gate oxide layers.

In metal oxide semiconductor ("MOS") technology, small, high performance transistors require thin cell dielectrics and high integrity gate silicon dioxide layers. An ultrathin ($\leq 100\text{Å}$) dielectric layer should minimally comprise enhanced dielectric properties. However, several additional design considerations must be examined in the manufacture of ultrathin dielectric layers. These include uniformity in thickness, reliability, high dielectric constant, as well as imperviousness to electrical and thermal breakdown. Ultimately, high performance, ultrathin dielectric layers should also comprise a low diffusion rate for impurities, low interface state density, and be chemically stable. Nevertheless, the physical constraints of the materials and methods of fabrication employed have made the characteristics of the dielectrics less than the optimum.

Silicon dioxide, at thicknesses greater than 100Å, provides a cost effective, high quality dielectric layer for single crystal silicon, polycrystalline silicon ("polysilicon"), or amorphous silicon substrates. Nonetheless, for dielectric layers less than 100Å, silicon dioxide is known to have a high defect density. Silicon dioxide also exhibits poor characteristics as a diffusion mask against impurities.

In light of silicon dioxide's inherent limitations for dielectric layers of 100Å or less, several alternatives have been developed. One such alternative is the use of silicon nitride ($Si_3N_4$) as a dielectric layer. This layer can be formed on a substrate's surface through a process which includes Rapid Thermal Nitridation ("RTN"). Under RTN, the silicon substrate is exposed to either pure ammonia ($NH_3$) or an ammonia plasma at temperatures approximately between 650° C. and 1150° C. for approximately 5 seconds to 60 seconds, depending on the flow rate, to form a silicon nitride film.

Precise ultrathin dielectric layers are currently fabricated employing RTN. However, these layers have several shortcomings. RTN-type ultrathin dielectrics lack uniformity in their overall composition. Furthermore, RTN-type ultrathin dielectrics have questionable reliability because of their electrical and thermal breakdown. Applying current RTN techniques, moreover, the maximum thickness of a silicon nitride layer formed is substantially in the range of 15Å to 25Å. This is attributed to the self-limiting characteristics of silicon nitride, when a silicon substrate or the like is exposed to a steady flow of $NH_3$. As such, to form silicon nitride layers having thicknesses greater than 35Å, a subsequent layer of silicon nitride must be deposited superjacent. The present approach in forming a silicon nitride layer employing RTN, thus, is limited because a minimum of two steps are necessary—first growing an initial layer of silicon nitride and second depositing a subsequent layer of silicon nitride to achieve the targeted thickness. It is also limited because a high thermal budget is required.

With respect to thin gate oxides, two methods are presently employed. In the first method, thermal oxidation in dry or wet $O_2$ ambients is used at elevated temperatures in a furnace to grow a silicon dioxide layer superjacent a silicon substrate. The second method for growing a thin gate oxide involves Rapid Thermal Oxidation ("RTO") in a rapid thermal processor at high temperatures over a short period of time.

These oxidation methods have substantial limitations. With respect to the furnace approach, gate oxides with a thickness in the 80Å to 120Å range are not as reliable. Moreover, RTO-type silicon dioxides require a high thermal budget and are further confined by throughput criteria which are not viable in a manufacturing environment.

SUMMARY OF THE INVENTION

The primary object of the present invention is to eliminate the aforementioned drawbacks of the prior art.

It is a further object of the present invention to provide a method of fabricating an ultrathin dielectric layer, having an increased thickness.

Another object of the present invention is to provide a method of fabricating an ultrathin dielectric layer of desired thickness in one process step.

Yet another object of the present invention is to provide a method for fabricating a semiconductor wafer requiring less overall process time.

A further object of the present invention is to provide a method of fabricating an ultrathin dielectric layer having a reduced thermal budget.

Still a further object of the present invention is to provide a method of fabricating semiconductor wafers at an increased throughput.

Another object of the present invention is to provide a method of fabricating a high integrity silicon dioxide layer for thin gate devices.

Still another object of the present invention is to provide a method of fabricating a silicon dioxide layer having an increased thickness by promoting enhanced oxidation kinetics.

A further object of the present invention is to provide a method of fabricating a silicon nitride layer having an increased thickness by promoting enhanced nitridation kinetics.

Yet another object of the present invention is to provide a method of fabricating a silicon dioxide layer requiring less overall process time.

Still a further object of the present invention is to provide a method of fabricating a silicon dioxide layer at a reduced thermal budget.

A further object of the present invention is to provide a method of fabricating a silicon nitride layer at a reduced thermal budget.

In order to achieve the hereinabove objects, as well as others which will become apparent hereafter, a method and system for fabricating semiconductor wafers is disclosed wherein a rugged and/or smooth, atomically clean, semiconductor substrate is provided in a rapid thermal processing ("RTP") chamber. The substrate can be single crystal, polycrystalline or amorphous silicon. In one embodiment of the present inventive method, the substrate is cleaned by exposing it to at least one of $CF_4$, $C_2F_2$, $C_2F_6$, $C_4F_8$, $CHF_3$, HF, $NF_3$, and $NF_3$ diluted with $Ar-H_2$ at a temperature substantially within the range of 650° C. to 1150° C. for approximately 10 to 60 seconds in the chamber. Subsequently, the clean substrate is exposed to a first gas and energy generating a first temperature substantially within the range of 650° C. to 1150° C. in situ under substantially high vacuum for approximately 5 seconds to 20 seconds. Simultaneous to exposing the substrate to the first gas, a second gas comprising fluorine as an oxidizing agent, preferably $NF_3$, is advanced by pulsing its introduction in situ under substantially high vacuum. By pulsing the introduction of the second gas, an on phase substantially in the range of 2 seconds to 5 seconds and an off phase substantially in the range of 5 seconds to 6 seconds is established. Preferably, the pulsing comprises two on and two off phases. In one embodiment of the present inventive method, the first gas comprises at least one of $O_2$ and $N_2O$ in combination with Ar to thereby fabricate a silicon dioxide layer superjacent the substrate. In this embodiment, the thickness of the silicon dioxide layer is in the approximate range of 100Å to 400Å. In a second embodiment of the present inventive method, the first gas comprises at least one of $NH_3$ to thereby fabricate a silicon nitride layer superjacent the substrate. In this embodiment, the thickness of the silicon nitride layer is in the approximate range of 50Å to 60Å.

Other objects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
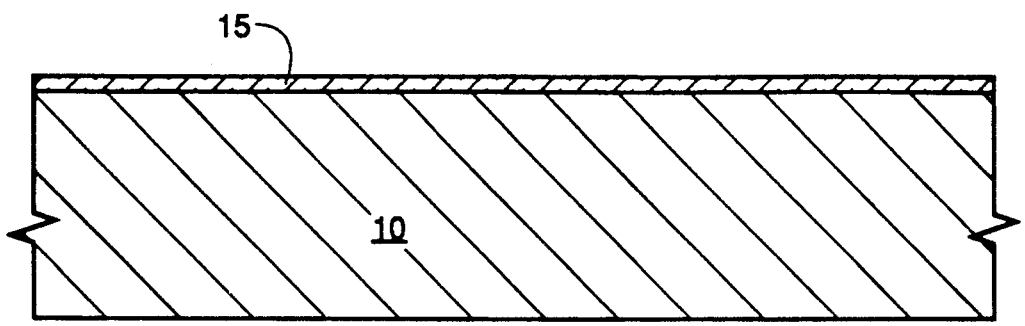
FIG. 1 is a cross-sectional view of a semiconductor substrate prior to undergoing the steps of the present invention.

Referring to FIG. 1, a semiconductor substrate 10 within a chamber (not shown) is illustrated prior to undergoing process of the present invention. Substrate 10 preferably comprises polycrystalline silicon ("polysilicon"), though single crystal silicon, amorphous silicon or any other suitable material known in art can also be employed. Further, substrate 10 can be rugged and/or smooth.

Substrate 10 should be atomically clean prior to beginning the present inventive method. A native silicon dioxide layer 15 can easily form superjacent substrate 10 by simple exposure to the atmosphere. Unfortunately, native silicon dioxide 15 has inferior electrical and structural characteristics when compared with other dielectric type materials, such as grown silicon dioxide. As such, the overall electrical and structural characteristics of the completed wafer having native silicon dioxide are substantially impacted. Thus, in order to maintain the wafer's integrity, any native silicon dioxide 15 formed should be removed by atomically cleaning substrate 10.

There are a variety of techniques for removing native silicon dioxide 15. Those known to one of ordinary skill in the art are not described. In the preferred embodiment of the present invention, native silicon dioxide 15 is removed by introducing a reactive gas comprising fluorine, such as (for example) $CF_4$, $C_2F_2$, $C_2F_6$, $C_4F_8$, $CHF_3$, HF, $N_3$, and $N_3$ diluted with $Ar-H_2$, and heat at a temperature substantially within the range of 650° C. to 1150° C. for approximately 10 to 60 seconds. In a preferred embodiment of the present invention, $NF_3$ diluted with $Ar-H_2$ is employed as the reactive gas. Relying on this method, any native silicon dioxide formation between 10Å and 20Å can be easily removed.

Figure 2:
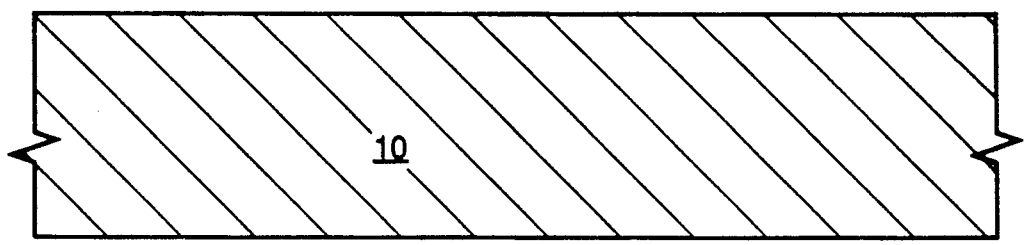
FIG. 2 is a cross-sectional view of a semiconductor substrate undergoing the first step of the present invention.

Referring to FIG. 2, the first step of the present invention involves providing an atomically clean substrate 10 into a chamber. To simplify the entire process, the chamber is preferably a Rapid Thermal Processing ("RTP") chamber. By employing an RTP chamber, substrate 10 can be directly cleaned and subsequently processed within the chamber. As such, the remaining step(s) of the present inventive method is preferably performed in situ under substantially high vacuum. However, in an alternate embodiment of the present invention, the remaining step(s) is performed in cluster tools. Employing such an approach, a load lock is created between each tool to avoid exposing the wafer during any part of the process to the atmosphere and contaminants.

Figure 3:
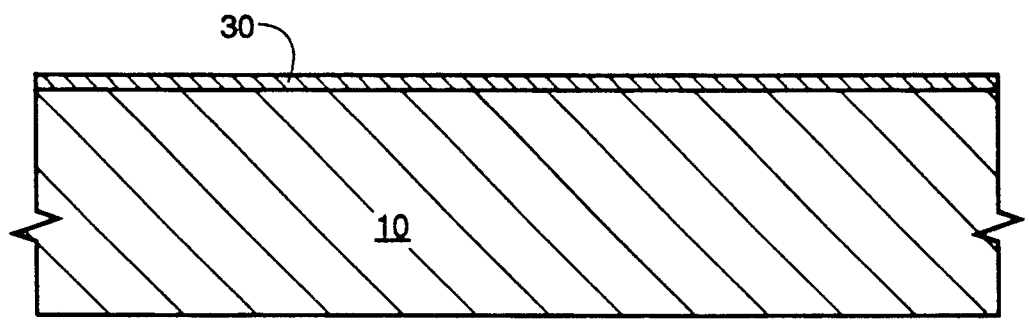
FIG. 3 is a cross-sectional view of a semiconductor substrate undergoing a first embodiment of the second step of the present invention.

Referring to FIG. 3, substrate 10 is illustrated having undergone a first embodiment of the second step of the present inventive method. As shown, layer 30 is formed superjacent clean substrate 10. Layer 30 comprises silicon nitride. In this embodiment of the second step, substrate 10 is simultaneously exposed to at least a first and second gas, as well as heated at a temperature substantially within the range of 650° C. to 1150° C. The first gas preferably comprises $NH_3$ to thereby fabricate silicon nitride layer 30. The second gas comprises an oxidizing agent, preferably $NF_3$. Further, unlike the first gas which is introduced into the chamber by means of a steady rate of flow, the second gas is presented by pulsing its introduction into the chamber.

The pulsed introduction of $NF_3$ is grounded in the chemical properties of $NF_3$. As an oxidizing agent, $NF_3$ is a potent compound for causing electron transfer. As such, a steady flow $NF_3$, in the face of a steady flow of $NH_3$, can inhibit the formation of silicon nitride layer 30 through the nitridation of substrate 10.

Figure 5A:
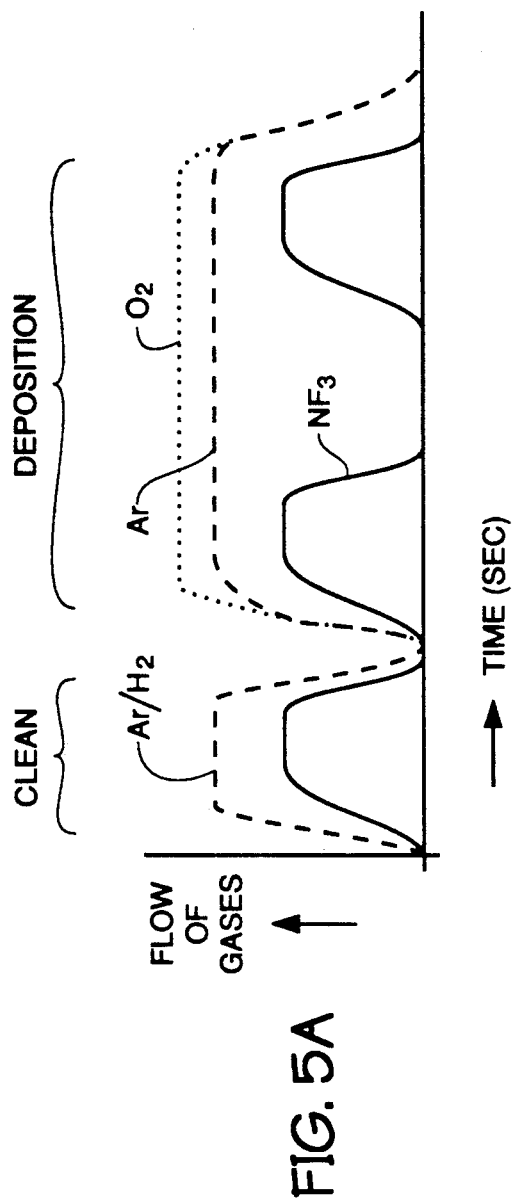
FIG. 5 (a) and (b) are graphs comparing the Flow Rate versus Time and Temperature versus Time involving the first and second steps of the present invention.
Figure 5B:
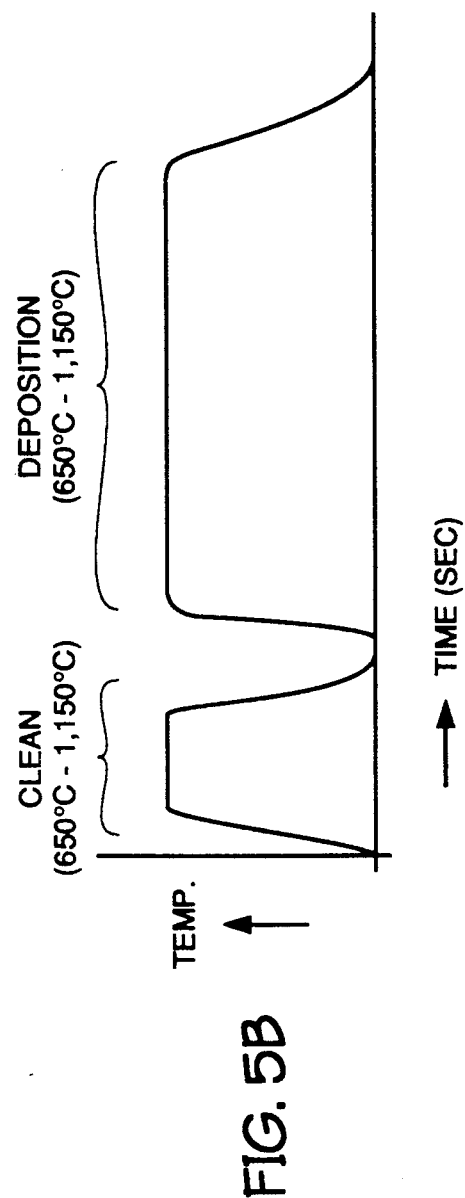

To overcome the inherent limitations of $NF_3$, given its potential strength as an oxidizing agent, silicon nitride layer 30 is formed by pulsing the introduction of $NF_3$. The pulsing introduction of $NF_3$ can be optimized in light of the etching rates of the substrate to allow for complete nitridation, as well as to avoid non-uniformity. Referring to FIG. 5 (a) and (b), this pulsing comprises an on phase and an off phase. During the on phase, $NF_3$ is introduced simultaneously with the steady flow introduction of $NH_3$ into the chamber. In contrast, during the off phase, only a steady flow of $NH_3$ is introduced into the chamber. In the preferred embodiment of the present invention, the on phase is substantially in the range of 2 seconds to 5 seconds, while the off phase is substantially in the range of 5 seconds to 6 seconds. Furthermore, in the preferred embodiment, the pulsed introduction of $NF_3$ occurs twice, such that there are two on phases and two off phases. Thus, in the preferred embodiment, the cycle time for steady flow of $NH_3$ and the concurrent pulsed introduction of $NF_3$ having two on and two off phases is substantially in the range of 14 seconds to 22 seconds.

As a result of the simultaneous introduction of $NH_3$ and pulsed $NF_3$ with heat over the entire step, silicon nitride layer 30 forms superjacent substrate 10. The silicon nitride layer created has a thickness dependent on two variables. The first variable is the flow rate of $NF_3$ and the second is pulse width of the on phase. At an on phase of approximately 2 seconds in combination with a flow rate of 200 sccm per minute, the thickness of silicon nitride layer 30 is approximately 60Å.

Figure 4:
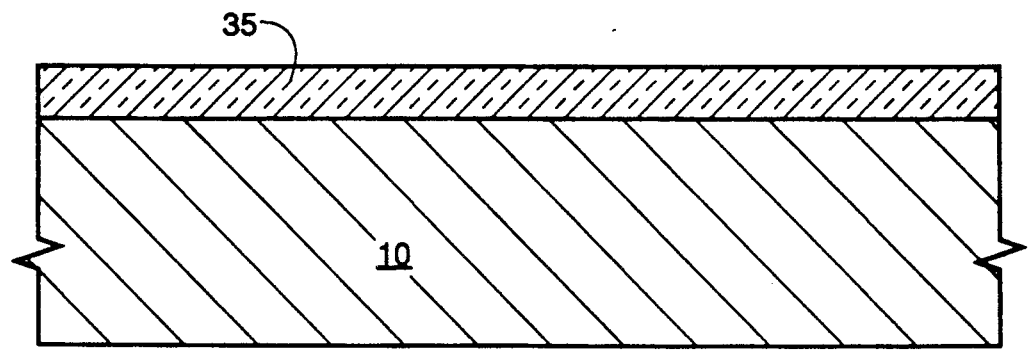
FIG. 4 is a cross-sectional view of a semiconductor substrate undergoing a second embodiment of the second step of the present invention.

Referring to FIG. 4, substrate 10 is illustrated having undergone a second embodiment of the second step of the present inventive method. As shown, layer 35 is formed superjacent clean substrate 10. Layer 30 comprises silicon dioxide. In this embodiment of the second step, substrate 10 is simultaneously exposed to at least a first and second gas, as well as heated at a temperature substantially within the range of 650° C. to 1150° C. The first gas comprises either $N_2O$ or $O_2$ to thereby form silicon dioxide layer 35.

Figure 6:
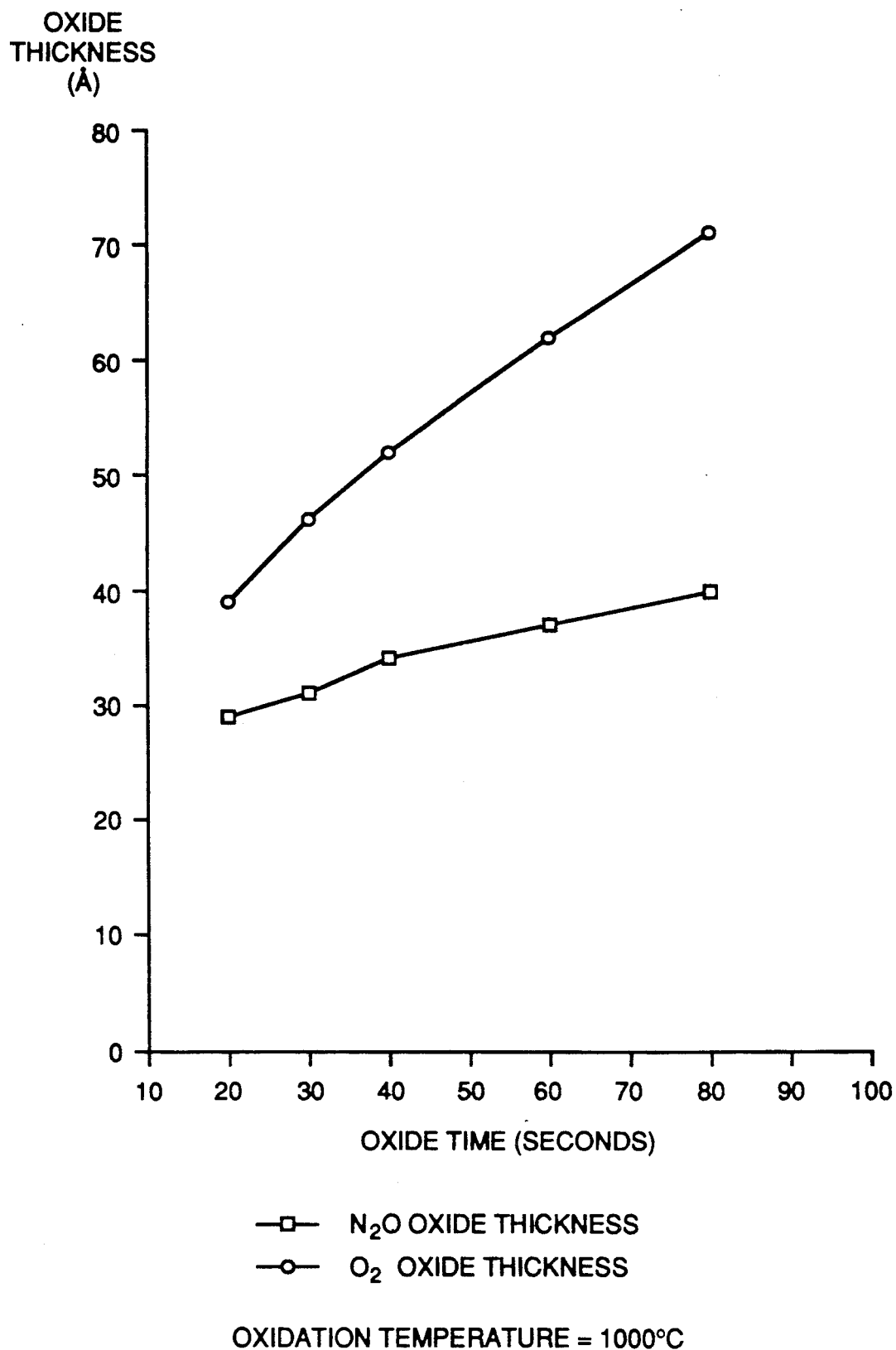
FIG. 6 is a graph comparing the Oxide Thickness versus Oxide Time characteristics of two embodiments of the proposed invention.

Referring to FIG. 6, a graph comparing the Oxide Thickness versus Oxide Time characteristics of $N_2O$ and $O_2$ is shown. From this graph, it should be obvious to one of ordinary skill in the art that $N_2O$ is preferred over $O_2$ when comparing the kinetics associated with both in the formation of silicon dioxide However, the $N_2O$ based oxidation approach is self-limiting, and as such, the oxidation takes place at a extremely slow rate. Thus, the oxidation rate can be accelerated by introducing the second gas which comprises an oxidizing agent—preferably $NF_3$. Further, unlike the first gas which is introduced into the chamber by means of a steady rate of flow, the second gas is presented by pulsing its introduction into the chamber.

The pulsed introduction of $NF_3$ is grounded in the chemical properties of $NF_3$. As an oxidizing agent, $NF_3$ is a potent compound for causing electron transfer. A steady flow $NF_3$, in the face of a steady flow of either $N_2O$ or $O_2$, can inhibit the formation of silicon dioxide layer 35 through the oxidation of substrate 10.

To overcome the inherent limitations of $NF_3$, given its potential strength as an oxidizing agent, silicon dioxide layer 35 is formed by pulsing the introduction of $NF_3$. The pulsing introduction of $NF_3$ can be optimized in light of the etching rates of the substrate to allow for complete oxidation, as well as to avoid non-uniformity. Referring to FIG. 5 (a) and (b), this pulsing comprises an on phase and an off phase. During the on phase, $NF_3$ is introduced simultaneously with the steady flow introduction of at least one of $O_2$ and $N_2O$, in combination with an inert gas into the chamber. Ar is preferably employed in light of its inert chemical properties. Ar is employed as a means for diluting the gases, as well as providing better control of the reaction. Ar inhibits the agglomeration of nitrogen species, through the introduction of $NF_3$, along the interface of substrate 10 during oxidation. This is also significant where $N_2O$ is employed to form silicon dioxide layer 35. Thus, by introducing Ar during both on and off phases, the uniformity of silicon dioxide layer 35 is substantially enhanced.

During the off phase, only a steady flow of either $O_2$ or $N_2O$, preferably in combination with Ar, is introduced into the chamber. In the preferred embodiment of the present invention, the on phase is substantially in the range of 2 seconds to 5 seconds, while the off phase is substantially in the range of 5 seconds to 6 seconds. Furthermore, in the preferred embodiment, the pulsed introduction of $NF_3$ occurs twice, such that there are two on phases and two off phases. Thus, in the preferred embodiment, the total cycle time for the steady flow of either $O_2$ or $N_2O$ in combination with Ar along with the concurrent pulsed introduction of $NF_3$ having two on and two off phases is substantially in the range of 14 seconds to 22 seconds.

As a result of the simultaneous introduction of $O_2$ or $N_2O$ in combination with Ar and pulsed $NF_3$ with heat over the entire step, silicon dioxide layer 35 forms superjacent substrate 10. The silicon dioxide layer 35 created has a thickness dependent on two variables. The first variable is the flow rate of $NF_3$ and the second is pulse width of the on phase. An on phase of approximately 2 seconds produces a thickness of approximately 400Å, where the pulsed flow rate is approximately 200 sccm per minute. This thickness will be reduced slightly were a pulsed flow rate of 300 sccm per minute employed. In that same light, an on phase of approximately 5 seconds given a pulsed flow rate of 300 sccm per minute produces a thickness of approximately 150Å. This thickness, given a pulsed flow rate of 200 sccm per minute, will be slightly increased.

With regards to either first or second embodiment, to improve uniformity in the formation of layer 30 or 35, all gases employed are introduced through a quartz baffle (not shown), also referred to as a quartz shower head. The baffle provides a means for the uniform disbursement of gases along the interface of substrate 10. The use of a quartz baffle should be obvious to one of ordinary skill in the art, and as such, is not described further.

While this invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It should be obvious to one of ordinary skill in the art, for example, that alternate gases may be employed using the above inventive technique to produce the same novel results. Moreover, it should be obvious to one or ordinary skill in the art that gate oxide layers comprise dielectric properties. It is, therefore, contemplated that the appended claims will cover any such modifications or embodiments as fall within the true scope of the invention.

What is claimed is:

1. A method for fabricating semiconductor wafers, comprising the steps of:
   providing a substantially clean substrate in a chamber;
   exposing said substrate to a first gas and energy, said energy generating a first temperature for a first time; and
   pulsing a second gas, said pulsing comprising an on phase and an off phase, said second gas comprising oxidizing characteristics, thereby forming a dielectric layer having a thickness superjacent said clean substrate, said dielectric layer having a different crystalline structure than said substrate.

2. A method for fabricating semiconductor wafers, according to claim 1, wherein said exposing said substrate and said pulsing a second gas are performed substantially concurrently.

3. A method for fabricating semiconductor wafers, according to claim 2, wherein said substrate comprises at least one of single crystal silicon, polycrystalline silicon, and amorphous silicon.

4. A method for fabricating semiconductor wafers, according to claim 2, wherein said clean substrate is cleaned by introducing a gas comprising at least one of $CF_4$, $C_2F_2$, $C_2F_6$, $C_4F_8$, $CHF_3$, HF, $NF_3$, and $NF_3$ diluted with $Ar-H_2$ and energy generating a second temperature substantially within the range of 650° C. to 1150° C. for approximately 10 seconds to 60 seconds.

5. A method for fabricating semiconductor wafers, according to claim 2, wherein said exposing said substrate and said pulsing a second gas are performed in situ under substantially high vacuum.

6. A method for fabricating semiconductor wafers, according to claim 2, wherein said second gas comprises fluorine.

7. A method for fabricating semiconductor wafers, according to claim 6, wherein said second gas comprises $N_3$.

8. A method for fabricating semiconductor wafers, according to claim 2, wherein said first time is substantially in the range of 5 seconds to 20 seconds.

9. A method for fabricating semiconductor wafers, according to claim 2, wherein said pulsing comprises two on phases.

10. A method for fabricating semiconductor wafers, according to claim 2, wherein said pulsing comprises two off phases.

11. A method for fabricating semiconductor wafers, according to claim 2, wherein said on phase is substantially in the range of 2 seconds to 5 seconds.

12. A method for fabricating semiconductor wafers, according to claim 2, wherein said off phase is substantially in the range of 5 seconds to 6 seconds.

13. A method for fabricating semiconductor wafers, according to claim 2, wherein said on phase comprises a flow rate substantially in the range of 100 sccm per minute to 300 sccm per minute.

14. A method for fabricating semiconductor wafers, according to claim 2, wherein said first gas comprises at least one of $O_2$ and $N_2O$.

15. A method for fabricating semiconductor wafers, according to claim 14, wherein said first gas further comprises Ar.

16. A method for fabricating semiconductor wafers, according to claim 14, wherein said layer comprises silicon dioxide.

17. A method for fabricating semiconductor wafers, according to claim 14, wherein said thickness is in the approximate range of 100Å to 400Å.

18. A method for fabricating semiconductor wafers, according to claim 2, wherein said first gas comprises $N_3$.

19. A method for fabricating semiconductor wafers, according to claim 18, wherein said layer comprises silicon nitride.

20. A method for fabricating semiconductor wafers, according to claim 18, wherein said thickness is in the approximate range of 50Å to 60Å.

21. A method for fabricating semiconductor wafers, according to claim 2, wherein said first temperature is substantially within the range of 650° C. to 1150° C.

22. A method for fabricating semiconductor wafers, comprising the steps of:
    providing a substantially clean substrate in a rapid thermal processing chamber, said substrate comprising at least one of single crystal silicon, polycrystalline silicon, and amorphous silicon;
    exposing said substrate to a first gas and energy generating a first temperature substantially within the range of 650° C. to 1150° C. in situ under substantially high vacuum for approximately 5 seconds to 20 seconds, said first gas comprising at least one of $O_2$ and $N_2O$ in combination with Ar; and
    pulsing a second gas comprising fluorine in situ under substantially high vacuum, said exposing said substrate and said pulsing a second gas being performed substantially simultaneously, said pulsing comprising an on phase substantially in the range of 2 seconds to 5 seconds and an off phase substantially in the range of 5 seconds to 6 seconds, thereby forming a silicon dioxide layer having a thickness superjacent said clean substrate.

23. A method for fabricating semiconductor dielectric layer, according to claim 22, wherein said thickness is substantially in the range of 100Å to 400Å.

24. A method for fabricating semiconductor wafers, comprising the steps of:
    providing a substantially clean substrate in a rapid thermal processing chamber, said substrate comprising at least one of single crystal silicon, polycrystalline silicon, and amorphous silicon;
    exposing said substrate to a first gas and energy generating a first temperature substantially within the range of 650° C. to 1150° C. in situ under substantially high vacuum, said first gas comprising $NH_3$; and
    pulsing a second gas comprising fluorine in situ under substantially high vacuum, said exposing said substrate and said pulsing a second gas being performed substantially simultaneously, said pulsing comprising an on phase substantially in the range of 2 seconds to 5 seconds and an off phase substantially in the range of 5 seconds to 6 seconds, thereby forming a silicon nitride layer having a thickness superjacent said clean substrate.

25. A method for fabricating semiconductor dielectric layer, according to claim 24, wherein said thickness is substantially in the range of 50Å to 60Å.

26. A method for fabricating semiconductor wafers, according to claim 2, wherein said first gas comprises nitrogen.

27. A method for fabricating semiconductor wafers, according to claim 22, wherein said pulsing comprises at least two on phases and at least two off phases, said on phase comprising a flow rate substantially in the range of 100 sccm per minute to 300 sccm per minute.

28. A method for fabricating semiconductor wafers, according to claim 24, wherein said pulsing comprises at least two on phases and at least two off phases, said on phase comprising a flow rate substantially in the range of 100 sccm per minute to 300 sccm per minute.

* * * * *